United States Patent [19]

Usagawa et al.

[11] Patent Number: 4,805,005

[45] Date of Patent: Feb. 14, 1989

[54] SEMICONDUCTOR DEVICE AND MANUFACTURING METHOD OF THE SAME

[75] Inventors: Toshiyuki Usagawa, Kokubunji; Yasuhiro Shiraki, Hino; Yuichi Ono; Susumu Takahashi, both of Tokyo; Norikazu Hashimoto, Hachioji, all of Japan

[73] Assignee: Hitachi, Ltd., Tokyo, Japan

[21] Appl. No.: 783,086

[22] Filed: Oct. 2, 1985

[30] Foreign Application Priority Data

Oct. 3, 1984 [JP] Japan ............................. 59-206220

[51] Int. Cl.$^4$ ........................................... H01L 29/80
[52] U.S. Cl. ....................................... 357/22; 357/16
[58] Field of Search ................ 357/22 A, 22 C, 22 I, 357/23.12, 22 MD, 23.2, 16

[56] References Cited

U.S. PATENT DOCUMENTS 4,605,945  8/1986  Katayama et al. ............... 357/22 A

FOREIGN PATENT DOCUMENTS 57-7165  1/1982  Japan .
57-118676  7/1982  Japan .
57-193067  11/1982  Japan .
58-147167  1/1983  Japan ............................. 357/22 MD
59-63770  4/1984  Japan ............................. 357/22 MD

OTHER PUBLICATIONS

Solomon, P. M. et al, "A GaAs Gate Heterojunction FET", *IEEE Electron Device Letters*, vol. EDL-5, No. 9, Sep. 1984, pp. 379-381.

Primary Examiner—Andrew J. James
Assistant Examiner—Sara W. Crane
Attorney, Agent, or Firm—Antonelli, Terry & Wands

[57] ABSTRACT

A semiconductor device and method of manufacturing the same. The device comprises a first n-type semiconductor layer and a second undoped semiconductor layer between which a hetero-junction is formed, and a third p-type embedded semiconductor layer, a gate metal formed without the exposure to air immediately after the third, second and first semiconductor layer are successively formed, and an external electrode connected with the third p-type embedded semiconductor layer, capable of controlling the carriers in the neighborhood of the hetero-junction. This semiconductor device greatly improves the controllability of the threshold voltage thereof, and provides the gate electrodes of good quality.

11 Claims, 5 Drawing Sheets

F I G. 3C
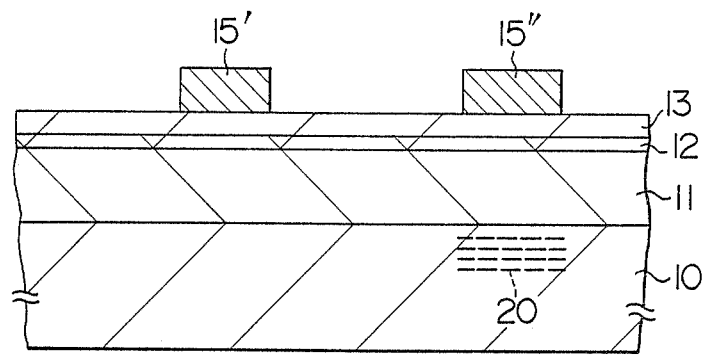
F I G. 3D
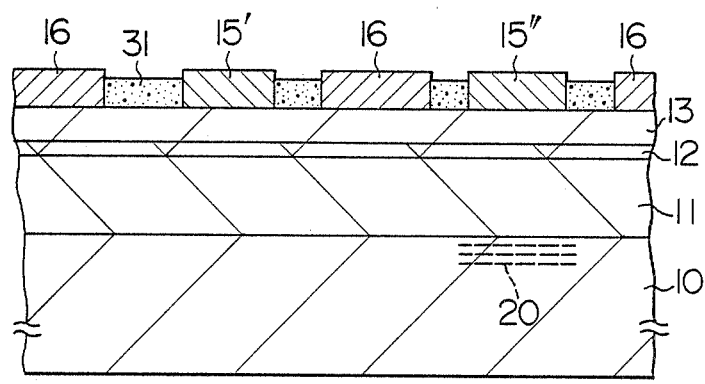
F I G. 3E
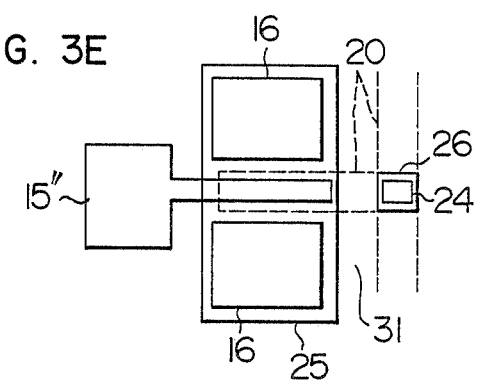

SEMICONDUCTOR DEVICE AND MANUFACTURING METHOD OF THE SAME

BACKGROUND OF THE INVENTION

This invention relates to a field effect transistor (FET) having an active layer of a two-dimensional electronic gas layer stored at a hetero junction, and a method of fabricating it, and more particularly to an FET suited to threshold value control and gate electrode formation and a method of fabricating it.

Examples of a hetero-junction type FET are disclosed in Japanese Patent Unexamined Publication Nos. 57-7165, 57-193067, 57-118676.

An example of the hetero junction FET as shown in FIG. 1 comprises, on a semi-insulating GaAs substrate 10, an undoped or unintentionally doped GaAs 11 of about 1 μm thick ("undoped" or "unintentionally doped" implies being a very weak n or p conductivity type as a result of intentionally non-doping impurities and its impurity concentration is less than $1 \times 10^{16}$ cm$^{-3}$, more preferably less than $1 \times 10^{15}$ cm$^{-3}$), an undoped or unintentionally doped $Al_xGa_{1-x}As$ (x≃0.3) layer 12 of 60 Å thick, an n-type $Al_xGa_{1-x}As$ (x≃0.3) layer 13 of 400 Å, and an n-type GaAs layer 14 of 200 Å, which are successively formed by crystal growth of an MBE (Molecular Beam Epitaxy) or OM-VPE method (Organic Metal Vapor Phase Deposition), and a gate electrode 15 and source-drain electrode 16, 16' formed after the crystal growth. In forming an enhancement type FET (E-FET) and/or a depletion type FET (D-FET) in one and the same substrate, the enhancement type FET has been hitherto formed in a manner of selectively etching the uppermost n-type GaAs layer 14 through dryetahing method and depositing on the $Al_xGa_{1-x}As$ layer 13 thus exposed a gate metallic electrode 15'.

A band structure at a cross section of the prior art D-FET type hetero junction FET is shown in FIG. 4. In the figure, numeral 15 denotes a gate electrode part, 13 denotes an AlGaAs layer containing door impurities, and 11 denotes an undoped GaAs layer substantially not containing impurities. The undoped GaAlAs layer 12 provides for increasing the mobility but is omitted for simplicity of illustration. $E_F$ designates the Fermi level. At the hetero interface, a potential well is provided due to the difference of electron affinity and two-dimensional carriers occur therein. These carriers 21 are supplied from the donor level 41 in the AlGaAs layer 13, and this donor level 41 and the two dimensional carriers 21 are in a thermal equilibrium state. Because the carriers 21 move through the GaAs layer 11 substantially not containing impurities, and are spatially separated from ionized donor impurities, dispersion thereof due to the impurity potential is greatly reduced, realizing a higher mobility inherent to GaAs. Thus, this prior art hetero junction FET has drawn attention from the viewpoint of the application to a high speed transistor.

However, despite of all the hoopla over the possibility of realization of a higher mobility, structural and technical problems associated with this hetero junction type FET have not been discussed much.

A first problem encountered in implementing a high-speed high-degree integrated circuit using these hetero junction type FET's is a method of controlling a threshold voltage $V_{Th}$ and a technique, directly associated therewith, of individually providing E-FET's and D-FET's in a common substrate.

The above-mentioned method of forming E/D FET's has posed a problem of deteriorating the $Al_xGa_{1-x}As$ layer due to injury by dry etching, making it impossible to form gate electrodes of good quality.

Moreover, GaAs and $Al_xGa_{1-x}As$ are very active in their surface so that when they are exposed to air through impurities, oxidation, etc., they are immediately contaminated, thereby preventing proper gate electrode formation.

On the other hand, the threshold voltage $V_{Th}$ of this FET (E-FET here) can be represented, omitting terms originating from the undoped GaAs layer, as follows:

$$V_{Th} = \phi_{Bn} - \Delta E_c/q - \frac{q N_D}{2\epsilon} d^2 \tag{1}$$

where $\phi_{Bn}$ is a height of a Schottky barrier at the gate electrode, $\Delta E_c$ is energy discontinuity amount of a conduction band, at the hetero junction part, q is a unit charge, $\epsilon$ is a permittivity, $N_D$ is a donor doping concentration, and d is a film thickness of the n-type AlGaAs layer.

Meanwhile, the greatest problem encountered in applying this FET to an integrated circuit (IC) is control of the threshold voltage of the E-FET. The application of the MBE or OM-VPE method provides nonuniformity of film thickness among production lots and greatly reduces production yield in the IC. Thus, in the application of the FET to the IC, the above film thickness d must be controlled within a range of 15 Å as understood from equation (1).

In short, the problems associated with the above prior art FET reside in the following two points:

1. The threshold voltage $V_{Th}$ has previously determined at the time of crystal growth.
2. Since the gate electrodes are formed after the exposure to air following the crystal growth, defective gate electrodes are liable to be formed.

SUMMARY OF THE INVENTION

An object of this invention is to provide a selectively doped hetero junction FET in which the threshold voltage $V_{Th}$ can be controlled by an external electrode and good gate electrodes can be formed and a method of manufacturing it.

Since the threshold voltage $V_{Th}$ can be controlled or adjusted by an external electrode after the crystal growth in accordance with this invention, severe restriction to the crystal growth that the film thickness on a wafer must be controlled with precision of ±1% can be obviated. The MBE method or OM-VPE method provides very excellent uniformity of crystal growth on a wafer surface by virtue of its specific crystal growth manner.

On the other hand, in the case of the crystal growth of the MBE method, the gate electrodes are formed in an ultra-high vacuum chamber in which wafers can be transferred in a ultra-high vacuum state, provided distinctly from a GaAs, $Al_xGa_{1-x}As$ crystal growth chamber in which Ga, As and Al are dispersed, by evaporation gate electrode metals, e.g., Ti, Mo, Al, WSiΔ, etc., in the ultra-high vacuum of $10^{-10}$ Torr or so. Moreover, in the case of the crystal growth of the OM-VPE method, the gate electrodes can be formed, after the crystal growth, by growth of the gate electrode metals on the entire wafer without exposure thereof to air, through the thermal decomposition of organic metals such as metal carbonyl complexes, i.e., W(CO)$_6$, Mo(CO)$_6$, etc., or derivations thereof, etc.

The problem associated with the above method of forming the gate electrodes without exposure to air is how to form E-FET's and D-FET's individually.

The feature of this invention resides in a method of fabricating a semiconductor device, which is capable of individually forming or providing E-FET's and D-FET's during crystal growth and forming gate electrode metals without exposure to air.

The method of fabricating a semiconductor device in accordance with this invention will be explained below with reference to FIGS. 2A to 2C.

A p-type GaAs layer 20 is previously embedded in a semi-insulating GaAs substrate 10 at the part immediately below the gate electrode of a device which is later to become an E-FET. Next, an undoped GaAs layer 11 ("undoped" implies substantially not containing impurities, i.e., being of very weak n-type or p-type conductivity as a result of not intentionally doping them) is formed on the resultant surface using the MBE method or OM-VPE method, and an undoped Al$_x$Ga$_{1-x}$As (x≈0.3–0.37) 12 of about 60 Å thick and a n-type Al$_x$Ga$_{1-x}$As (x≈0.3–0.37) 13 of 100 Å–700 Å thick are successively grown.

After the above process, the embedded p-type layer is kept in a floating condition or may be coupled to an external control electrode so as to be at an external potential. This p-type embedded layer is normally reverse-biased so that the FET associated therewith can be at E-FET. A number of E-FET's thus provided and having the embedded p-type layers below their gate can be controlled in their threshold voltage by connecting the embedded p-type layers 20 of only the necessary E-FET's and suppling the embedded p-type layers with an external potential through the above control electrode. Thus, the FET's desired to have the same threshold voltage V$_{Th}$ in the same wafer can be controlled, so as to have the same threshold voltage V$_{Th}$ by connecting the p-type embedded layers 20 with each other and applying the p-type layers with a certain external potential.

The principle of this invention will be explained with reference to the energy band as shown n FIGS. 4, 5 and 6. FIG. 5 shows a band of the homo-junction between a normal n$^-$ (or p$^-$) type semiconductor 11 and a p-type semiconductor 51. As well known, in the neighborhood of the junction interface, holes are diffused towards the n$^-$ (or p$^-$) semiconductor 11 due to the abrupt change of the hole concentration in the p-type semiconductor 51 to a position where the holes are balanced with the electostatic potential due to the spacial change of the space charges existing in both semiconductors occurring in the neighborhood of the junction interface, and lie in an equilibrium state. On the other hand, now, the structure commonly having the semiconductor layer 11 in FIGS. 4 and 5 using the hetero junction as shown in FIG. 4 is considered. If the semiconductor layer 11 is sufficiently thick, the two-dimensional electron gas stored at the hetero junction interface between the semiconductor layers 13 and 11 is not influenced by the p-type layer 51 as shown in FIG. 5. However, when the semiconductor layer 11 is thin to some extent in the case where it has a very high purity and very weak n$^-$(or p$^-$) conductivity, this two dimensional electron gas is influenced in its concentration by the p-type layer 51 so that the electrons move into the p-type layer 51 and thus, in an extreme case, carriers of the two-dimensional electron gas at the hetero-junction interface substantially disappear as shown in FIG. 6.

Accordingly, the new structure hing the p-type layer below the hetero-junction interface as shown in FIG. 6 enables to change a D-FET into an E-FET.

Moreover, as shown in FIG. 7, the two dimensional electron gas at the hetero junction interface can be controlled by externally applying a voltage to the electrode 50 connected with the p-type layer 51.

In this way, the n-type AlGaAs later 13 may be very roughly controlled in its thickness. Thus, only the threshold value control for the D-FET is required.

In this invention, immediately after the n-type AlGaAs layer 13 has been grown, without the exposure thereof to air, the gate metal 15 is formed thereon The feature of the process in accordance with this invention resides in: in the case of using the MBE method as epitaxial crystal growth, the sample is normally transferred into another chamber in a ultra-high vacuum after the crystal growth and the gate metal is evaporated in the very high vacuum; and in the case of using the OM-VPE method as epitaxial crystal growth, the gate metal is formed by an organic thermal decomposition of metal carbonyls, i.e., W(CO)$_6$, Mo(CO)$_6$, etc.

The gate metal thus formed is subjected to a photolithography to provide gate areas 15', 15" (see FIG. 2B).

Thereafter, source-drain electrodes 16 are formed and further the external control electrode (not shown) to be connected with the embedded p-type layer 20 is formed (see FIG. 2C).

The embedded p-type layer is also used to adjust the threshold voltage V$_{Th}$ of the D-FET.

The embedded p-type layer according to this invention makes the best use of the property of a semiinsulating GaAs substrate. More specifically, embedding such a p-type layer permits all the associated embedded p-type layers to be placed to the same potential. In this way, the embedded p-type layers can be used as embedded wirings in the semi-insulating substrate.

In the process of evaporating the gate metal without the exposure to air, the gate metal is formed on the n-type GaAs layer as well as the n-type Al$_x$Ga$_{1-x}$As layer.

When the p-type layers are reverse-biased, a small amount of leak current is produced and eventually voltage differences occur among the p-type layers in a wafer. In this case, external control terminals for keeping the p-type layers at the same potential may be provided at plural positions in the wafer.

BRIEF DESCRIPTION OF THE DRAWINGS

FIGS. 3A to 3E are views showing the manufacturing steps in one embodiment according to this invention.

DESCRIPTION OF THE PREFERRED EMBODIMENTS

Embodiment 1

One embodiment of this invention in the case of using the MBE method for crystal growth will be explained with reference to FIGS. 3A to 3E.

Figure 1:
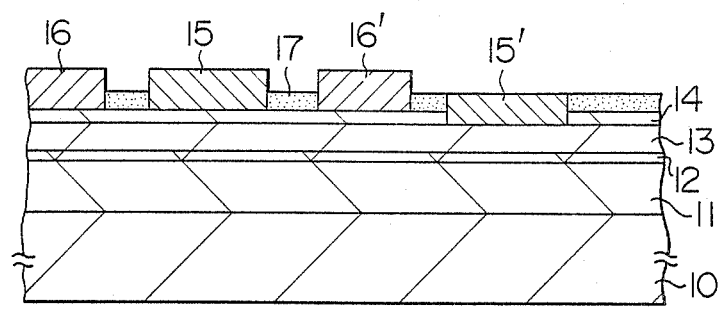
FIG. 1 is a cross sectional view of the prior art selective doped hetero-junction type FET.
Figure 2A:
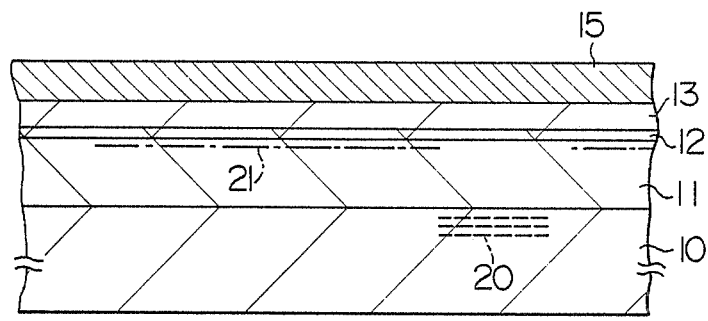
FIGS. 2A to 2C are cross sectional views showing the manufacturing steps of the selective doped heterojunction type, FET according to this invention.
Figure 2B:
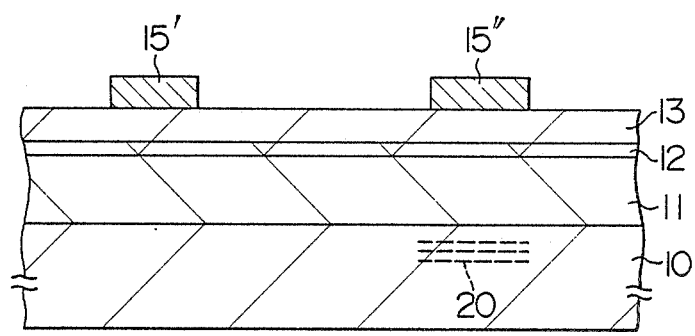
Figure 2C:
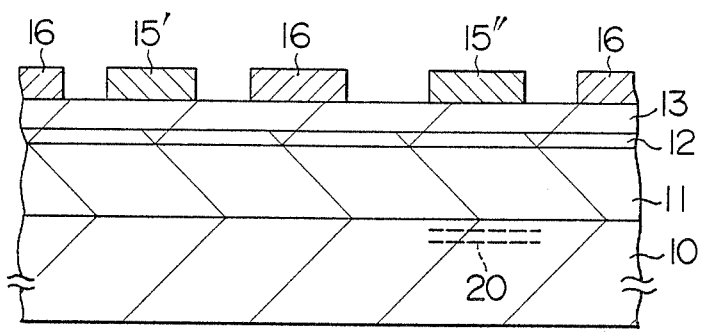
Figure 3A:
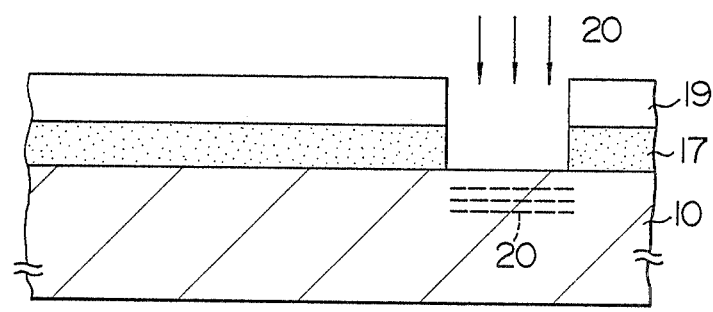

First, an $SiO_2$ film 17 of 3000 Å is deposited on a semi-insulating GaAs substrate (wafer) 10 by the CVD method. Next, a photoresist 19 of 1.5 μm is applied onto the $SiO_2$ film 17, a part corresponding to the gate area of an E-FET is removed as shown in FIG. 3A and Mg ions 20 are implanted with a dose of $1 \times 10^{12}$ cm² at an accelerating voltage of 200 kV. After removal of the photoresist film 19, an $SiO_2$ film (not shown) of 2000 Å is deposited onto the resultant surface and the substrate is subjected to annealing in an atmosphere of $H_2$ at 900° C. for twenty (20) minutes. At this time, the p-type GaAs layer 20 thus formed has a doping concentration of $10^{17}$ cm$^{-3}$. The $SiO_2$ films are removed using a mixed liquid of hydrofluoric acid and ammonium fluoride.

Figure 3B:
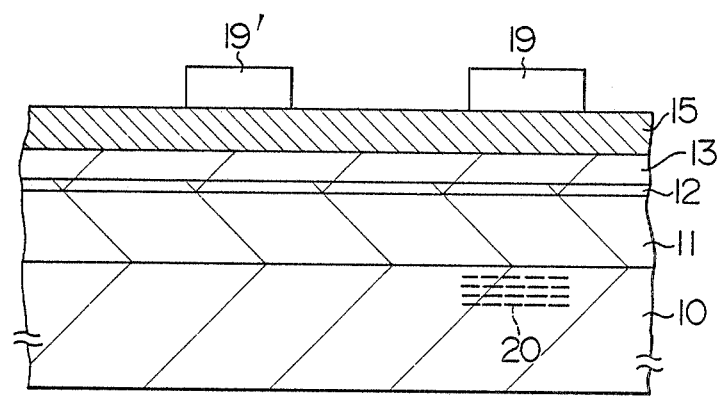
Figure 4:
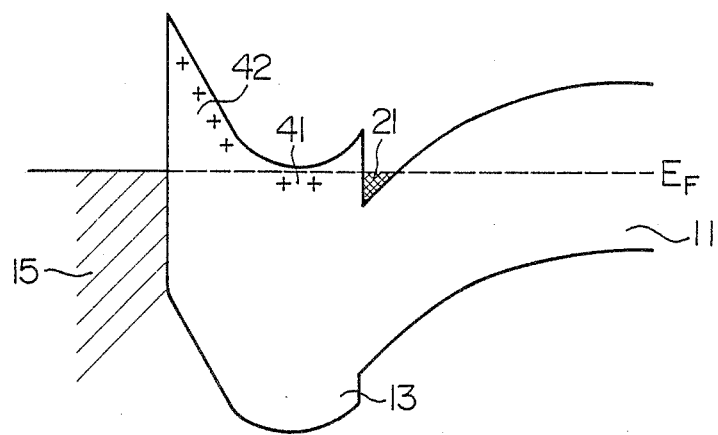
FIGS. 4 to 7 show energy band structures for explaining the principle of this invention, respectively.
Figure 5:
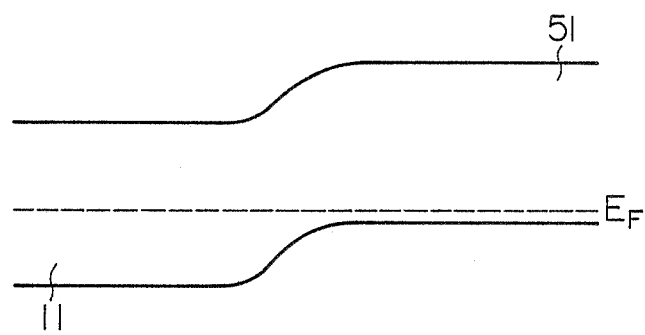
Figure 6:
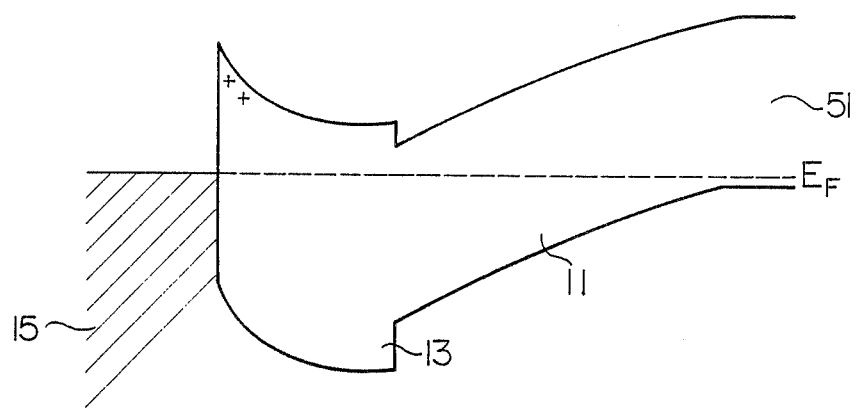
Figure 7:
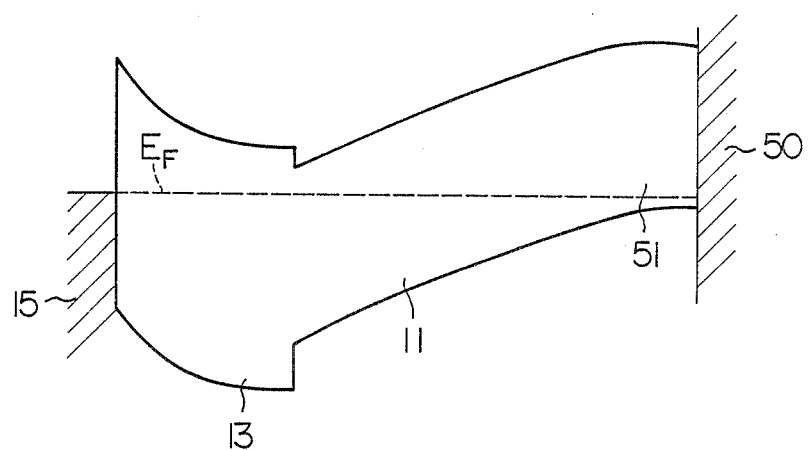

Next, as shown in FIG. 3B an "undoped" or "unintentionally doped" GaAs layer 11 of 1 μm thick is grown at a substrate temperature of 580° C. using the MBE device in a ultra-high vacuum of $10^{-11}$ Torr. Subsequently, an undoped or unintentionally doped $Al_xGa_{1-x}As$ (x≃0.3) layer 12 of about 60 Å thick and an n-type $Al_xGa_{1-x}As$ (x≃0.3) layer 13 of 300 Å thick, doped with Si of $2 \times 10^{18}$ cm$^{-3}$ are successively grown; the n-type $Al_xGa_{1-x}As$ layer 13 is normally used with a thickness of 100 Å–500 Å, a doping amount of $7 \times 10^{17}$ cm$^{-3}$–$2 \times 10^{19}$ cm$^{-3}$, and x of 0.2–0.37. The wafer is transferred, while it remains in a ultra-high vacuum of $10^{-11}$ Torr, from the epitaxial growth chamber to another chamber of a ultra-high vacuum of $10^{-11}$ Torr using a transfer manipulator. Mo 15 of 1500 Å as a gate metal is evaporated on the entire resultant surface there. This gate metal may be also Ti, Wsix (tungsten silicide), WAl (tungsten aluminun), etc.

As shown in FIG. 3C, gate electrodes 15', 15" are formed through dry etching using photoresists 19', 19" as masks. At this time, the resultant surface is subjected to reactive ion etching using a mixed gas of $NF_3$ and $N_2$ to enhance the selectivity of the etching with the $Al_xGa_{1-x}As$ layer 13 and reduce the surface damage.

An $SiO_2$ film 31 of 3000 Å as a passivation film is formed by the CVD method, and the $SiO_2$ film on the gate electrodes and the $SiO_2$ film corresponding to source-drain regions are etched away using the photolithography.

As shown in FIG. 3C, the source-drain electrodes 16 are formed using photoresists as masks through the liftoff method. The metal used is AuGe/Ni/Au.

Thus, the FET's each having the p-type embedded layer 20 become E-FET's while those each not having it become D-FET's.

After the completion of the FET's, the $SiO_2$ film 31, $Al_xGa_{1-x}As$ layers 13, 12 and GaAs layer 11 are etched to form a contact hole 24 used for an external electrode to be in ohmic contact with the p-type embedded layer 20 (FIG. 3E). Incidentally, FIGS. 3A to 3D are cross sectional views of the device and FIG. 3E is a plan view specifically showing the neighborhood of the gate part. 25 in FIG. 3E denotes a mesa etching region for element separation.

In order to vary the threshold voltage by reversebiasing the p-type embedded layer 20, the breakdown voltage between the p-type layer and the undoped GaAs layer 11 should be sufficiently large. To this end, the carrier concentration of the p-type layer is preferably as small as possible, that is, the p-type dopant concentration of about $10^{15}$ cm$^{-3}$ is preferably used (however, in the case of controlling $V_{Th}$ by the external voltage, there is not specific restriction to the concentration).

When the dopant concentration in the p-type layer 20 is too large, impurities may diffuse during the crystal growth thereby to pollute the undoped GaAs layer. Be, Zn, Ge, etc can also be as the p-type dopant.

Embodiment 2

In this embodiment, the OM-VPE method instead of the MBE method is used for crystal growth of the epitaxial layers 11, 12 and 13, and the gate metal 15 is formed in the manner different from Embodiment 1. More specifically, first, the undoped GaAs layer of 1 μm, undoped $Al_xGa_{1-x}As$ (x=0.3) layer of 60 Å and n-type $Al_xGa_{1-x}As$ (x=0.3, n type dopant concentration ≃2×cm) layer of 300 Å are successively grown in the same manner as in Embodiment 1 at a substrate temperature of 650° C. using the OM-VPE method. Thereafter, purging is performed within the reactor tube for about two minutes in an atmosphere of $H_2 + AsH_3$. Subsequently, Mo(CO) is introduced into the reactor tube using $H_2$ as a carrier gas and thermally decomposed at the same temperature as that of the crystal growth, i.e. 650° C. to deposit a Mo thin film of about 1500 Å as a gate metal on the grown n-type $Al_xGa_{1-x}As$ layer. W, Wsix, WAl, etc. instead of Mo can also be used as the gate metal.

The gate electrode and source-drain electrodes are formed in the same manner as Embodiment 1.

A plurality of FET's required are connected with each other through the p-type embedded layers and connected with the external control terminal(s) through the contact hole(s) so that the threshold voltages $V_{Th}$'s thereof can be set at substantially the same value. Thus, the dispersion of $V_{Th}$ among production lots, conventionally encountered in the MBE method and OM-VPE method, which will be caused mainly by the dispersion of the film thickness and doping level among lots, can be greatly reduced. The dispersion of $V_{Th}$ among lots in this embodiment, $\sigma V_{Th} = 10$ mV.

It should be noted that the semiconductor device and the method of manufacturing it in accordance with this invention can be effectively applied in providing FET's using the other compound semiconductor, e.g., InP-InGaAsP, InP-InGaAs, InAs-InAsSh, GaAs-AlGaAsP, $Al_yGa_{1-y}As_xGa_{1-x}As$ etc.

In accordance with this invention, since after the provision of the p-type embedded layer the selective doped hetero-junction structure is formed and the gate metal is evaporated without the exposure to air, (1) The threshold voltage can be controlled by applying the external voltage after the crystal growth. Thus, the controllability of the threshold voltage can be considerably enhanced.

(2) Since the gate electrode can be formed without the exposure to air, the stability of the gate electrode for the threshold voltage is greatly improved.

(3) Connecting the FET's required in an IC with each other through the p-type embedded layers makes the best use of the excellent uniformity of the film thickness, specific to the MBE method and the OM-VPE method. Namely, the threshold voltage $V_{Th}$ of the E-FET can be externally controlled to a desired value and so the dispersion thereof among lots becomes as small as $\sigma V_{Th} = 10$ mV.

We claim:

1. A semiconductor device comprising:
   a plurality of field effect transistors, each field effect transistor including,
   an undoped first semiconductor layer,
   an n-type second semiconductor layer formed on the first semiconductor layer, the second semiconductor layer being smaller in electron affinity than the first semiconductor layer,
   a two-dimensional electron gas on a surface on the second semiconductor layer side of said first semiconductor layer,
   a control electrode formed on the second semiconductor layer and controlling a flow of electrons in said two-dimensional electron gas, and
   electrodes each electrically connected to a respective side of said two-dimensional electron gas; and
   at least one of said field effect transistors having a p-type embedded layer which is selectively provided in opposition to the respective control electrode for said at least one of said field effect transistors, with respect to the first semiconductor layer, so as to control the threshold voltage of said at least on of said field effect transistors, and wherein at least one other of said field effect transistors does not have said p-type embedded layer.

2. A semiconductor device according to claim 1, wherein said first semiconductor layer is provided on a semi-insulating semiconductor layer, and said p-type embedded layer is formed by selectively doping an impurity in the semi-insulating semiconductor layer.

3. A semiconductor device according to claim 1, including at least one set of a plurality of the p-type embedded layers electrically connected together.

4. A semiconductor device according to claim 1, wherein said p-type embedded layer is spaced from said two-dimensional electron gas.

5. A semiconductor device according to claim 1, wherein, said at least one of said field effect transistors having the p-type embedded layer is an enhancement-type field effect transistor.

6. A semiconductor device according to claim 1, wherein the p-type dopant concentration of the p-type embedded layer is about $10^{15}$ cm$^{-3}$.

7. A semiconductor device comprising:
   a plurality of field effect transistors, each field effect transistor including,
   an undoped first semiconductor layer,
   an n-type second semiconductor layer formed on the first semiconductor layer, the second semiconductor layer being smaller in electron affinity than the first semiconductor layer,
   a two-dimensional electron gas on a surface on the second semiconductor layer side of said first semiconductor layer,
   a control electrode formed on the second semiconductor layer and controlling a flow of electrons in said two-dimensional electron gas, and
   electrodes each electrically connected to a respective side of said two-dimensional electron gas; and
   at least one of said field effect transistors having a p-type embedded layer which is selectively provided in opposition to the respective control electrode for said at least one of said field effect transistors, with respect to the first semiconductor layer, so as to control the threshold voltage of said at least one of said field effect transistors, and wherein at least one of the field effect transistors has an electrode for supplying the p-type embedded layer with a voltage from outside of the semiconductor device.

8. A semiconductor device comprising:
   a plurality of field effect transistors, each field effect transistor including,
   an undoped first semiconductor layer,
   an n-type second semiconductor layer formed on the first semiconductor layer, the second semiconductor layer being smaller in electron affinity than the first semiconductor layer,
   a two-dimensional electron gas on a surface on the second semiconductor layer side of said first semiconductor layer,
   a control electrode formed on the second semiconductor layer and controlling a flow of electrons in said two-dimensional electron gas, and
   electrodes each electrically connected to a respective side of said two-dimensional electron gas; and
   at least one of said field effect transistors having a p-type embedded layer which is selectively provided in opposition to the respective control electrode for said at least one of said field effect transistors, with respect to the first semiconductor layer, so as to control the threshold voltage of said at least one of said field effect transistors, the semiconductor device including at least one set of a plurality of the p-type embedded layers electrically connected together, wherein the at least one set includes a plurality of control electrodes for supplying the at least one set with a voltage from outside of the semiconductor device.

9. A semiconductor device comprising:
   a plurality of field effect transistors, each field effect transistor including,
   an undoped first semiconductor layer,
   an n-type second semiconductor layer formed on the first semiconductor layer, the second semiconductor layer being smaller in electron affinity than the first semiconductor layer,
   a two-dimensional electron gas on a surface on the second semiconductor layer side of said first semiconductor layer,
   a control electrode formed on the second semiconductor layer and controlling a flow of electrons in said two-dimensional electron gas, and
   electrodes each electrically connected to a respective side of said two-dimensional electron gas; and
   at least one of said field effect transistors having a p-type embedded layer which is selectively provided in opposition to the respective control electrode for said at least one of said field effect transistors, with respect to the first semiconductor layer, so as to control the threshold voltage of said at least one of said field effect transistors, the semiconductor device including at least two sets of a plurality of the p-type embedded layers electrically connected together, each of said at lest two sets including at least one control electrode for supplying each set with a voltage from outside of the semiconductor device.

10. A semiconductor device comprising:
    a plurality of field effect transistors, each field effect transistor including,
    an undoped first semiconductor layer, an n-type second semiconductor layer formed on the first semiconductor layer, the second semiconductor layer being smaller in electron affinity than the first semiconductor layer,
a two-dimensional electron gas on a surface on the second semiconductor layer side of said first semiconductor layer,
a control electrode formed on the second semiconductor layer and controlling a flow of electrons in said two-dimensional electron gas, and
electrodes each electrically connected to a respective side of said two-dimensional electron gas; and
at least one of said field effect transistors having a p-type embedded layer which is selectively provided in opposition to the respective control electrode for said at least one of said field effect transistors, with respect to the first semiconductor layer, so as to control the threshold voltage of said at lest one of said field effect transistors, said at least one of said field effect transistors having said p-type embedded layer being an enhancement-type field effect transistor, and at least one other of said first effect transistors does not have said p-type embedded layer, said at least one other of said field effect transistors being a depletion-type field effect transistor, whereby said semiconductor device includes both enhancement-type and depletion-type field effect transistors.

11. A semiconductor device according to claim 10, wherein said plurality of field effect transistors are formed utilizing single first and second semiconductor layers on a single substrate, whereby said plurality of field effect transistors are formed on a single substrate.

* * * * *